United States Patent
Choi

(10) Patent No.: US 10,732,933 B2
(45) Date of Patent: Aug. 4, 2020

(54) GENERATING RANDOM BITSTREAMS WITH MAGNETIC TUNNEL JUNCTIONS

(71) Applicant: SanDisk Technologies LLC, Plano, TX (US)

(72) Inventor: Won Ho Choi, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/976,384

(22) Filed: May 10, 2018

(65) Prior Publication Data
US 2019/0347074 A1 Nov. 14, 2019

(51) Int. Cl.
| G06F 7/58 | (2006.01) |
| H01L 43/02 | (2006.01) |
| H01L 27/22 | (2006.01) |
| G11C 11/16 | (2006.01) |
| H03K 3/84 | (2006.01) |

(52) U.S. Cl.
CPC ............ *G06F 7/588* (2013.01); *G11C 11/161* (2013.01); *G11C 11/1653* (2013.01); *G11C 11/1673* (2013.01); *G11C 11/1675* (2013.01); *H01L 27/228* (2013.01); *H01L 43/02* (2013.01); *H03K 3/84* (2013.01)

(58) Field of Classification Search
CPC ...................................................... G06F 7/588
USPC ........................................................ 708/255
See application file for complete search history.

(56) References Cited

U.S. PATENT DOCUMENTS

| 7,969,767 | B2 | 6/2011 | Li et al. |
| 9,368,716 | B2 | 6/2016 | Gu et al. |
| 9,620,706 | B2 | 4/2017 | Lee et al. |
| 10,200,058 | B1* | 2/2019 | Choi .................. H03M 1/1245 |
| 10,365,894 | B2* | 7/2019 | Kuo ....................... H01L 43/02 |
| 2010/0258887 | A1 | 10/2010 | Zhu et al. |
| 2010/0302843 | A1 | 12/2010 | Li et al. |

(Continued)

FOREIGN PATENT DOCUMENTS

WO 2016204750 A1 12/2016

OTHER PUBLICATIONS

Choi, Won Ho et al, "A Magnetic Tunnel Junction Based True Random Number Generator with Conditional Perturb and Real-Time Output Probability Tracking," Dept. of ECE, University of Minnesota, Minneapolis, MN, USA, 4 pages, 2014.

*Primary Examiner* — Tan V Mai
(74) *Attorney, Agent, or Firm* — Volpe and Koenig, P.C.

(57) ABSTRACT

True random number generation (TRNG) circuits are presented which employ magnetic tunnel junction (MTJ) elements that can change magnetization state probabilistically in response to application of electrical pulses. Some implementations include pulse generators which apply perturbation sequences to the MTJ elements. The MTJ elements responsively produce randomized outputs related to changes in magnetization states. Probability compensators are included which monitor for deviations in measured probabilities in the randomized outputs from a target probability. The probability compensators make adjustments to the perturbation sequences to influence probabilistic changes in the magnetization states of the MTJ elements and bring the measured probabilities to within a predetermined deviation from the target probability.

25 Claims, 7 Drawing Sheets

(56) References Cited

U.S. PATENT DOCUMENTS

| | | | |
|---|---|---|---|
| 2011/0194337 A1* | 8/2011 | Wang | B82Y 25/00 365/158 |
| 2011/0229985 A1 | 9/2011 | Li | |
| 2011/0303997 A1* | 12/2011 | Wang | B82Y 25/00 257/421 |
| 2012/0280337 A1 | 11/2012 | Cao et al. | |
| 2013/0073598 A1 | 3/2013 | Jacobson et al. | |
| 2013/0135925 A1* | 5/2013 | Scheuerlein | G11C 13/0004 365/163 |
| 2013/0175644 A1 | 7/2013 | Horng et al. | |
| 2014/0022837 A1 | 1/2014 | Wang et al. | |
| 2014/0067890 A1 | 3/2014 | Zhu et al. | |
| 2014/0099735 A1 | 4/2014 | Horng et al. | |
| 2014/0175582 A1* | 6/2014 | Apalkov | H01L 43/08 257/425 |
| 2016/0028544 A1* | 1/2016 | Hyde | H04L 9/0869 380/44 |
| 2017/0046129 A1* | 2/2017 | Cambou | G06F 7/582 |
| 2017/0330070 A1* | 11/2017 | Sengupta | G06F 7/48 |
| 2018/0067725 A1* | 3/2018 | Cambou | H03K 3/84 |
| 2018/0239590 A1* | 8/2018 | Gupta | G06F 7/588 |
| 2019/0272870 A1* | 9/2019 | Choi | G11C 11/1673 |
| 2019/0347074 A1* | 11/2019 | Choi | H03K 3/84 |

\* cited by examiner

GENERATING RANDOM BITSTREAMS WITH MAGNETIC TUNNEL JUNCTIONS

TECHNICAL FIELD

Aspects of the disclosure are related to the field of random number generation circuitry and systems.

BACKGROUND

Random number generation has become an important part of modern technology with regard to secure communications, encryption schemes, robust data storage, and other technology areas. Many systems which rely upon random number generators actually employ what is known as pseudo-random number generators. Pseudo-random number generators (PRNGs), also known as deterministic random-number generators, produce numerical strings that approximate true randomness. Although these schemes are not truly random, they suffice for many applications in the realm of security, encryption, and the like. However, numbers generated by these PRNGs are still somewhat deterministic, and thus hardware-based random number generation circuitry has been developed.

Hardware random number generators, also referred to as true random number generator (TRNG), rely upon physical properties or processes which have naturally stochastic components. Random outputs produced from these hardware systems are much closer to truly randomized outputs. Thus, TRNG are employed in applications where higher security and less deterministic random numbers are desired.

Attempts at employing magnetic tunnel junction (MTJ) arrangements into hardware TRNGs have been undertaken. An MTJ operates using tunnel magnetoresistance (TMR), which is a magneto-resistive effect. MTJs typically consist of two ferromagnets separated by a thin insulator through which electrons can quantum-mechanically tunnel from one ferromagnet into the other. In the presence of thermal noise, a switching behavior of an MTJ due to flow of an input current can be observed to be stochastic in nature. However, variability in manufacturing and variability in stochastic behaviors among MTJs can place limits on how well these elements behave in TRNG systems. Moreover, random bitstreams can still require a lengthy timeframe to generate multi-digit random numbers, leading to slower overall TRNG processes for use in the various applications discussed above.

Overview

Random number generation circuits are presented which employ magnetic tunnel junction (MTJ) elements that can change magnetization state probabilistically in response to application of electrical pulses. Some implementations include pulse generators which apply perturbation sequences to the MTJ elements. The MTJ elements responsively produce randomized outputs related to changes in magnetization states. Probability compensators are included which monitor for deviations in measured probabilities in the randomized outputs from a target probability. The probability compensators make adjustments to the perturbation sequences to influence probabilistic changes in the magnetization states of the MTJ elements and bring the measured probabilities to within a predetermined deviation from the target probability.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
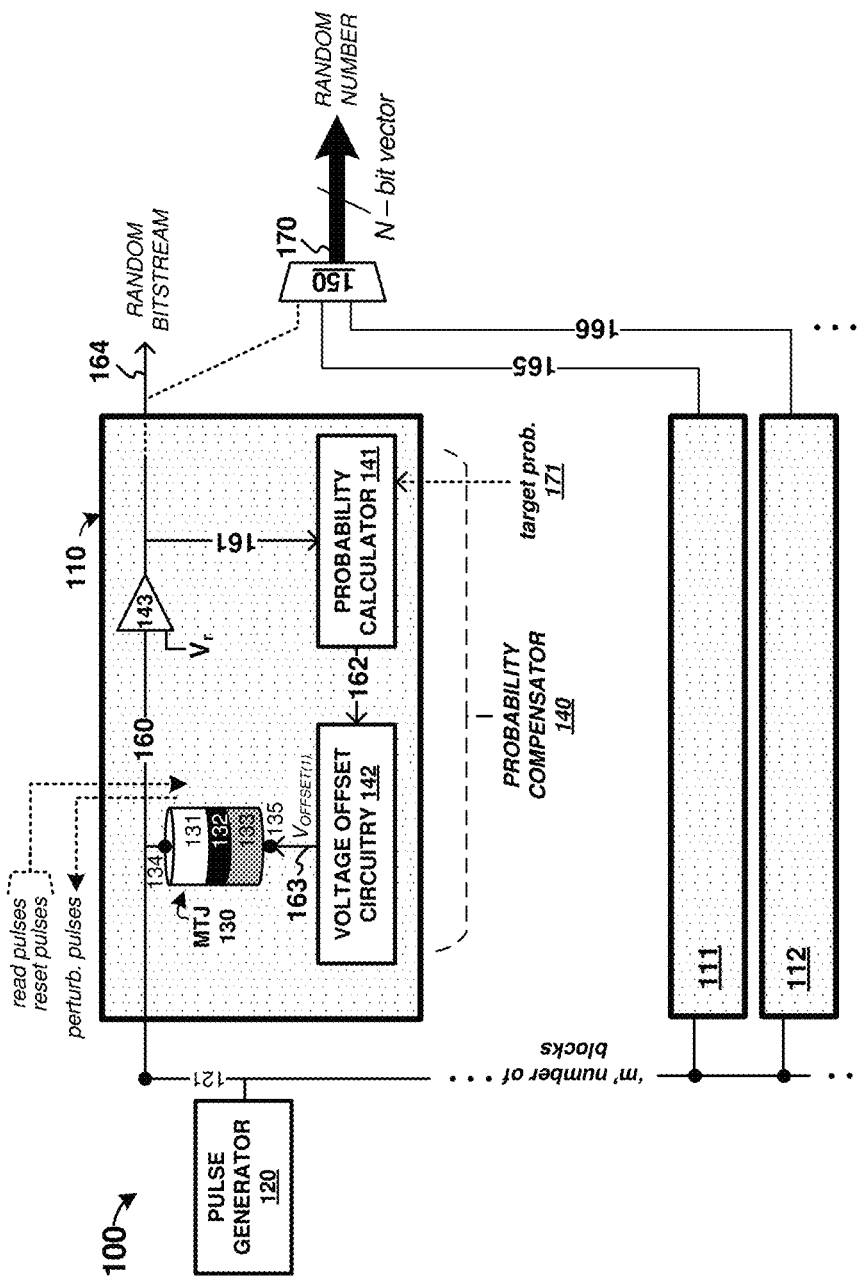
FIG. 1 illustrates an example random number generation system.

Discussed herein are various enhanced random number generator circuits and arrangements that employ magnetic tunnel junction (MTJ) elements having probabilistic magnetization state switching properties. Various enhanced support circuitry, interconnect, and control systems are also discussed. In the random number generator circuits discussed herein, at least one MTJ element is included along with circuitry to drive the MTJ element to produce random bit values, random bitstreams, or random bit vectors. Probability compensators are employed which compensate for variability among MTJ elements, as well as for timewise drift and other factors. Probability compensators also bring the random number generator circuits to within a probability target, such as to form random number generation configurations. When deployed with the probability compensators, random number generation circuits generate random numbers which are independent, unpredictable, nondeterministic, and aperiodic. These random numbers can be employed in various applications, such as generation of encryption keys and ciphertext for use in secure data storage operations and secure communications, among other applications. Also, large parallel arrays of individual random number generator circuits, referred to herein as random bitstream generator circuits, can be formed which advantageously provide for faster random number generation than a single random number generator circuit.

As used herein, magnetic tunnel junction elements or MTJ elements are each components of electrical circuits that consist of at least two layers of ferromagnetic materials separated by a thin insulator through which electrons can tunnel from one ferromagnetic layer into the other ferromagnetic layer. One ferromagnetic layer of an MTJ element can be referred to as a pinned layer which has a fixed magnetization state, while another ferromagnetic layer of an MTJ element comprises a free layer which can change in magnetization state. The intermediate layer comprising a thin insulator separating the two ferromagnetic layers can be formed from an oxide material or other suitable electrical insulator. Electrical terminals can be formed to interface the free and pinned layers of the MTJ element to other components in a circuit, referred to herein as free layer terminals and pinned layer terminals.

A spin-transfer torque (STT) MTJ element is one example arrangement of MTJ element than can be employed in random number generator circuitry. STT refers herein to devices in which spin polarized currents reversibly switch a magnetization state of a ferromagnetic layer, namely a magnetization state of the free layer mentioned above. In the presence of thermal noise, a switching behavior of the free layer of a MTJ element due to flow of an applied perturbation pulse through an associated pinned layer can be observed to be stochastic in nature, and the probability of switching magnetization states in the MTJ element increases with the magnitude or duration of the applied perturbation pulse. Both perpendicular or parallel arrangements of MTJ elements can be employed, which refers to a type of magnetic anisotropy associated with a preferred direction of alignment in magnetic moments within the MTJ element, with respect to a surface of a corresponding semiconductor substrate.

Individual random bitstream generator circuits each produce a series of random bit values, referred to herein as a random bitstream. These individual random bitstreams are produced responsive to cyclical application of perturbation sequences to associated MTJ elements of the individual random bitstream generator circuits. In an example perturbation sequence to produce a single random number, perturbation circuitry applies an initial reset voltage which is large enough to force the MTJ element into a reset state. Subsequent to the reset voltage, the perturbation circuitry applies a smaller perturbation voltage with an opposite polarity to induce spin transfer torque (STT) switching in the MTJ element with target 50% probability. Then, the perturbation circuitry applies a small read voltage to the MTJ element with the same polarity as the reset voltage to produce a resolved state for readout of the MTJ element. An n-bit random number with a single random bitstream generator circuit might require 'n' perturbation sequences be applied to the random bitstream generator circuit. Parallel circuit arrangements can also be formed to improve random number generation speed. Random number generation speed is improved by a factor of 'm' times when 'm' levels of parallel random bitstream generator circuits are employed. Thus, 'n'/'m' perturbation sequences can be employed when using parallel arrangements for generating n-bit random numbers.

However, in the presence of MTJ element variations, each perturbation pulse cannot guarantee a 50% probability for all MTJ elements employed in an array, or for individual MTJ elements over time. This can be the case even when each perturbation pulse employs similar characteristics, such as matching pulse widths or pulse amplitudes. Advantageously, in the examples herein, probability compensation circuitry is employed as a control loop for each individual random bitstream generator circuit. This probability compensation circuitry can adjust a reference potential provided to MTJ elements to calibrate magnetization switching behavior of the MTJ elements under applied perturbation sequences.

Probability compensation processes can be applied with various periodicity, such as one-time adjustments, periodic adjustments made after a predetermined time period, or adjustments made in 'real-time' for compensation of every random bit value generated. One-time adjustments can be made during a manufacturing test process, and can compensate for manufacturing tolerances, manufacturability issues, and other characteristics which might vary in associated circuitry but remain relatively steady after an initial timeframe. Periodic adjustments can be made at each power-on, startup, or boot process for a random number generator circuit, and can account for various circuit degradations over time due to inherent lifetime limitations of integrated circuitry, such as MTJ cell degradation. Real-time adjustments can be made with fast turnaround times, such as calibration turn-around times faster than single bit generation times. Real-time adjustments can compensate for short-term transient effects, such as thermal transients, ambient noise environments, and other fast-changing transients. The real-time compensation might compensate every random bit value generated, or for a predetermined quantity of random bit values.

The random number generator circuitry discussed herein can also employ multi-channel arrays of individual random bitstream generator (RBG) circuits that include corresponding MTJ elements and provide enhanced operation and random number generator functionality, while having scalable and selectable speed, ease in manufacturability, as well as lower switching current than other previous approaches. Moreover, the random number generator circuitry that employs MTJ elements herein can be assembled into dense horizontal arrays and vertical stack-ups. These vertical stack-ups allow deployment in multi-layered magnetic random-access memory (MRAM) configurations which might combine data storage MTJ elements along with MTJ elements employed in random number generator circuitry. In this manner, high density stack-ups of random number generator circuitry embedded in MRAM arrays can be built up from semiconductor substrates. Various interconnect and control logic can be formed on the same semiconductor substrate, allowing for large integrated memory and random number generator circuitry to be established in a compact integrated circuit. Moreover, MRAM array control circuitry, such as address decoders, sense amplifiers, bit lines, word lines, and other circuitry/interconnect can be multi-purpose to handle both random number generator arrangements and data storage arrangements.

FIG. 1 is presented as a first example of a random number generator system. FIG. 1 is a system diagram illustrating random number generator system 100. System 100 includes one or more random bitstream generator (RBG) circuits 110-112, pulse generator 120, and output circuitry 150. Bitstream outputs from random bitstream generator circuits 110-112 are output over associated links 164-166, which can also be provided to output element 150. When employed, output element 150 transmits a random number output at link 170, which comprises a combined bit vector output formed from bitstreams of a plurality of parallel random bitstream generator circuits. Link 170 comprises an electrical output node for the circuit presented as system 100.

Random numbers, as discussed herein, can comprise a digital or binary representation of a number comprised of one or more bits. A bitstream, as discussed herein, comprises a series or string of bits. When a bitstream is produced by an associated RBG circuit, the bitstream is referred to herein as a random bitstream. Bitstreams from one or more RBG circuits can be combined to form bit vectors. Thus, the term random bitstream discussed herein refers to a series or string of bits produced by a single RBG circuit, while the term random bit vector discussed herein refers to a multi-digit random number. The random bit vectors discussed herein are typically formed by combining outputs of more than one RBG circuit or a selected portion of a single bitstream.

Each random bitstream generator (RBG) circuit 110-112, referred to herein as RBGs 110-112, comprises MTJ element 130, probability calculator 141, voltage offset circuit 142, and sense amplifier 143. Probability calculator 141 and voltage offset circuit 142 comprise probability compensator 140, which is included in each RBG circuit 110-112. An input to each RBG circuit is coupled to pulse output terminal 121 of pulse generator 120. Perturbation sequences are applied by pulse generator to associated MTJ elements over pulse output terminal 121, which is coupled to a free layer terminal 134 of MTJ element 130. Free layer terminal 134 of MTJ element 130 is also coupled to a sense input of sense amplifier 143. A reference terminal of sense amplifier 143 is coupled to a reference voltage $V_R$, which may be a different voltage than $V_{OFFSET}$. A pinned layer terminal 135 of MTJ element 130 is coupled to a reference voltage output 163 of voltage offset circuitry 142. The reference voltage output 163 is referred to herein as $V_{OFFSET}$.

In operation, a plurality of random bitstream generators are deployed in a generally parallel fashion between pulse generator 120 and output element 150 to provide 'm' parallel random bitstream generators. The plurality of random bitstream generators are referred to herein as RBG circuits 110-112, among further RBG circuits when employed. In the example of FIG. 1, RBG circuits 110-112 each produce a random bitstream output. These bitstream outputs can be employed individually by further circuitry and systems, or can be combined by output element 150 into a multi-digit random number for presentation over link 170. Optional registers or memory elements can be included in output element 150 to store one or more random number outputs prior to transmission over link 170.

A mentioned above, each of RBG circuits 110-112 includes a corresponding MTJ element 130. These MTJ elements can change magnetization states responsive to perturbation pulses applied by associated pulse generator 120. The magnetization state changes of MTJ elements 130 can be viewed as stochastic or probabilistic processes, which are affected by at least pulse width and pulse amplitude characteristics of the perturbation pulses. Pulse generator 120 each determine a perturbation sequence for a corresponding MTJ element 130 based on a target probability, such as 50% probability for true random number generation. The perturbation sequence typically includes three phases or operations, namely a reset phase, a perturbation phase, and a read phase—each with an accompanying pulse signal applied to the associated MTJ element. Characteristics of perturbation pulses applied during perturbation phases are determined by pulse generator 120 based at least on the target probability and properties of MTJ elements 130. In FIG. 1, these pulses are shown for RBG circuit 110 to exemplify pulses for any of RBG circuits 110-112. Read pulses and reset pulses are applied in a first direction or polarity to MTJ elements 130, whereas perturbation pulses are applied to MTJ elements 130 in a second direction or polarity opposite that of the first direction.

Taking the example of RBG circuit 110, read pulses applied by pulse generator 120 to MTJ element 130 can indicate present magnetization states on link 160. Sense amplifier 143 can sense the present magnetization state and produce an output reflective of the magnetization state for MTJ element 130 over link 164. Since MTJ element 130 changes magnetization state according to both the applied perturbation pulses and stochastic properties of at least the MTJ element, then outputs produced for MTJ element 130 can vary for each applied perturbation sequence. Thus, bitstream outputs produced at link 164 correspond to magnetization states of MTJ element 130 after application of at least a read pulse portion of the perturbation sequence. As mentioned above, output element 150 might be configured to merge, concatenate, or otherwise combine bitstream outputs from many RBG circuits to produce a random number output comprising an n-bit vector over link 170.

Repeated application of the perturbation pulses alternated with the read pulses and corresponding reset pulses produce a series of randomized bit outputs for each RBG circuit, and in some examples, a random bit vector output for system 100. However, the bitstream outputs of each MTJ element and corresponding RBG circuit might not be achieving a target probability. Deviations from the target probability, such as a 50% probability, can lead to non-random or deterministic outputs with less effective downstream applications. These deviations can result from variations in pulses applied by pulse generator 120, thermal variations and noise, differences in characteristics among MTJ elements, manufacturing tolerances for each circuit element including MTJ elements, electrical or magnetic transient effects, or other factors. Actual measured probabilities for magnetization state changes of MTJ elements of the RBG circuits can be influenced by making adjustments to at least reference voltages applied to the MTJ elements.

To compensate for at least some of these deviations, probability compensator is provided in FIG. 1. Probability compensator 140 comprises a feedback circuit which can monitor bitstream outputs produced by an RBG circuit to determine a present probability of bitstream outputs by the RBG circuit. This probability is calculated by probability calculator 141 which monitors outputs of sense amplifier 143 over link 161, which is indicative of magnetization states of MTJ element 130. Once a probability is determined, which might span several samples of link 161 or a period of bitstream outputs by the RBG circuit, probability calculator 141 produces a probability deviation indicator over probability output terminal 162. Probability output terminal 162 comprises an electrical link between probability calculator 141 and voltage offset circuitry 142. Voltage offset circuitry 142 receives this probability indicator over probability output terminal 162 and produces a voltage offset ($V_{OFFSET}$) which alters a reference potential applied at node 163 to pinned layer terminal 135 of MTJ element 130. This alteration in $V_{OFFSET}$ alters an effective amplitude of an applied perturbation pulse to the associated MTJ element by altering the reference potential applied to MTJ element 130. Thus, $V_{OFFSET}$ adjusts a probability of switching magnetization states for MTJ element 130. Probability compensator 140 can be omitted in some examples to provide uncompensated bitstream outputs or uncompensated parallel bitstream outputs.

Although a 50% target probability is typically employed to form a true random number generator, other target probabilities can be selected using the circuitry and systems discussed herein. The target probability is selectable over a probability range. The target probability can be adjusted by altering characteristics of the applied perturbation sequences, or by making adjustments to $V_{OFFSET}$. Probability adjustment circuitry, such as probability compensator 140, can monitor for deviations in measured probabilities from a target probability among the magnetization states of MTJ elements. Probability compensator 140 can monitor a predetermined quantity of randomized bitstreams or bit vector outputs to determine the measured probabilities. Probability compensator 140 then initiates the adjustments to the perturbation sequences. Once a measured probability is determined, then probability compensator 140 can determine adjustments to either applied perturbation sequences or $V_{OFFSET}$ that are needed to bring the present probability to within a predetermined deviation of the target probability. Probability compensator 140 can provide indications of the adjustments to either voltage offset circuitry 142 or to pulse generator 120 to enact the adjustments.

When adjustments to the perturbation sequences are indicated, then pulse generator 120 can make adjustments to at least the perturbation pulses to influence probabilistic changes in the magnetization states of the MTJ elements and bring the measured probabilities to within a predetermined deviation of the target probability. Pulse generator 120 makes the adjustments to the perturbation pulses by at least altering one or more among pulse amplitudes and pulse widths associated with application of the perturbation pulses to the MTJ elements in the plurality of single-bit random bitstream generators. Although not shown in FIG. 1 for clarity, pulse generator 120 can have an input terminal, which might comprise an input voltage, that sets at least one of a pulse width and pulse amplitude of the perturbation pulses to achieve at least an initial approximation of the target probability for corresponding MTJ elements.

Since each MTJ element might differ in characteristics, manufacturing tolerances, transient effects, and other factors, a single perturbation pulse width/amplitude selection or adjustment might not produce the target probability across all MTJ elements. Thus, pulse generator 120 can produce a 'coarse' adjustment for target probabilities across all MTJ elements employed in the plurality of single-bit random bitstream generators. Fine-tuning adjustments can be made using the $V_{OFFSET}$ adjustment techniques herein to individually adjust each MTJ element switching behavior to conform to the target probability. When these fine-tuning adjustments to $V_{OFFSET}$ are indicated, then voltage offset circuitry 142 can adjust reference voltages applied to the MTJ elements in the plurality of single-bit random bitstream generators. Advantageously, this target probability can be achieved for all MTJ elements despite the variations among the MTJ elements.

Turning now to a further discussion of the elements of FIG. 1, each of the control elements discussed herein might be comprised of discrete circuitry and logic, or might include integrated portions incorporated into processing systems, microprocessors. However, for the examples herein, exemplary discrete circuitry is discussed. MTJ elements 130 are typically discrete elements or formed among an array of MTJ elements, such as in a MRAM or other device.

Pulse generator 120 comprises bidirectional pulse generation and delivery circuitry. Pulse generator 120 has an associated pulse output terminal 121 over which voltage or current pulses are transmitted. Pulse generator 120 comprises processing or logic circuitry to determine pulse widths and pulse amplitudes output over pulse output terminal 121 based on a target probability. This target probability can be hard-coded or hard-wired into pulse generator 120, or might instead comprise a control input to pulse generator 120 (not shown for clarity in FIG. 1). The pulses produced by pulse generator 120 comprise voltage pulses or current pulses of a particular duration, amplitude, and direction or polarity. Various control signals can be presented to pulse generator 120 to initiate perturbation sequences comprising reset pulses, read pulses, and perturbation pulses. One or more switching elements, such as transistors or transmission gates, can be included in pulse generator 120 to selectively provide the various pulses during associated operational phases.

Each magnetic tunnel junction (MTJ) element 130 comprises a spin transfer torque (STT) MTJ element, which has an alterable magnetization state. Each MTJ element 130 comprises a first ferromagnetic layer 131 and a second ferromagnetic layer 133 disposed on opposing sides of a thin insulating layer 132. The first ferromagnetic layer 131 of each MTJ element comprises a free ferromagnetic layer (referred to herein as a free layer) consisting of a ferromagnetic material that permits a magnetic moment of the corresponding ferromagnetic material to change orientation in response to an electromagnetic force. This change in magnetic moment orientation is referred to herein as a magnetization state, which changes relative to the second ferromagnetic layer 133 of each MTJ element. This second ferromagnetic layer 133 is referred to herein as a pinned layer, although other common nomenclature can be used, such as a reference layer or a fixed layer. The pinned layer of each MTJ element is a layer of ferromagnetic material that holds a magnetic moment of the corresponding ferromagnetic material in a predetermined or fixed state even under the influence of the electromagnetic force which might change the state of the free layer. When the free layer and the pinned layer are in the same magnetization state, then the MTJ element is considered to be in a parallel state (P). When the free layer and the pinned layer are in a different magnetization state, then the MTJ element is considered to be in an anti-parallel state (AP). Thus, the alterable magnetization state of MTJ elements discussed herein can change among two states, namely a parallel state and an anti-parallel state.

Due to probabilistic behavior of MTJ elements, each particular application of a perturbation pulse to an MTJ element may (or may not) change the magnetization state of the perturbation element. Thermal noise present in the MTJ element and thermal noise variations in associated perturbation pulse currents or voltages can add probabilistic or stochastic variability to magnetization state changing behaviors of the MTJ element. Properties of the perturbation pulses, such as amplitude/magnitude and duration/width, can influence the probabilistic or stochastic switching behavior of the associated MTJ element. Thus, repeated perturbation or 'write' attempts can be performed followed by corresponding read and reset attempts to produce a series of magnetization state changes of the MTJ element. In the examples herein, perturbation pulse widths and amplitudes typically determined by pulse generator 120 according to a target probability, such as 50% probability, among other probabilities.

Each MTJ element 130 also has corresponding terminals which can be used by external circuitry to apply pulses and reference voltages. Specifically, each MTJ element 130 has free layer terminal 134 which electrically couples free layer 131 of the MTJ to an electrical node or electrical circuit link. Each MTJ element 130 also has pinned layer terminal 135 which electrically couples pinned layer 133 of the MTJ to an electrical node or electrical circuit link. Typically, pinned layer terminal 135 is coupled to an adjustable reference node, and free layer terminal 134 is coupled to a pulse generator for application of voltage or current pulses.

Sense amplifier 143 can be included which senses voltage or current changes with respect to a corresponding reference voltage, $V_R$. A sense terminal of sense amplifiers 143 is coupled to link 160, and a reference terminal of sense amplifier 143 is coupled to $V_R$ or ground voltage. Sense amplifier 143 produces voltages that are representative of magnetization states of MTJ element 130. Responsive to each read pulse produced by pulse generator 120, a signal on link 160 corresponds to a magnetization state of MTJ element 130. A magnetization state of MTJ element 130 can be indicated by voltage or current changes produced on link 160 responsive to read pulses applied to the MTJ element 130 by pulse generator 120. Sense amplifier 143 can detect these voltage changes or current changes, which might comprise voltage spikes or current spikes, and produce an output in a selected signal format. This selected format might include a logic level or voltage range indicating a binary bitstream output representation of present magnetization states of MTJ element 130. This selected format might instead indicate only when a magnetization state changes, thus sense amplifier 143 might produce a bitstream output that changes logic levels when MTJ element 130 changes state from an initial state to a resultant state.

Probability calculator 141 comprises a probability calculation element and probability output terminal 162. In this example, a probability calculation element includes circuitry configured to monitor bitstream outputs on link 161/164 and determine a probability that corresponds to the bitstream outputs. The bitstream outputs might be monitored for a predetermined period of time, or predetermine quantity of samples, among other durations. Probability calculator 141 might sum changes indicated in the bitstream outputs and average the sum over the quantity of samples to determine a probability exhibited by the bitstream outputs. Probability calculator 141 can comprise an averaging element that is formed by summation circuitry, averaging circuitry, or output result combination and storage circuitry, among other elements. Summation circuitry or summation elements can include logical sum blocks, logical adders, arithmetic circuitry, or microprocessor circuitry configured to produce summed outputs, among other circuitry. Probability calculator 141 can also include binary counting circuitry for the bitstream outputs, which might comprise various logic circuitry, such as logic gates, flip flops, shift registers, and the like. Alternatively, bitstream counters can comprise microprocessor circuitry or systems with operational instructions to count changes in magnetization states of MTJ elements.

Voltage offset circuitry 142 comprises a voltage offset generator and an output terminal 163. The output terminal comprises an electrical node that produces an adjustable reference potential. Voltage offset circuitry 142 can include voltage level shifting circuitry, voltage offset circuitry, operational amplifiers, sense amplifiers, reference buffers, and other circuitry. A voltage offset generator creates $V_{OFFSET}$ adjustments for associated MTJ elements as reference potentials coupled to the MTJ elements. Adjustable reference voltages can be provided over reference terminal 163. A voltage offset generator also comprises logic circuitry or other processing circuitry to convert a probability indicator or probability deviation indicator presented on probability output terminal 162 into a voltage offset. Voltage offset circuitry 142 then implements the voltage offset on link 163.

Output element 150 has one or more inputs that couple to bitstream outputs of any number of RBG circuits, such as RBG circuits 110-112 in FIG. 1. Output element 150 also provides a digital output for system 100, indicated by link 170 in FIG. 1. In some examples, output element 150 comprises a concatenation element to present several parallel inputs as a combined output, or a serializer circuitry to present several parallel inputs as a serial output. Output element 150 can include storage circuitry, registers, and memory elements, among other elements that store a multi-bit vector representing one or more random number outputs for presentation over link 170. One or more ranks or stages of registers or memory elements can be included to store multi-bit vectors corresponding to one or more random number generation cycles. An output node is also provided by output element 150. An output node, as discussed herein, comprises an electrical node that presents and transmits random numbers produced by one or more random bitstream generator circuits 110-112. In FIG. 1, link 170 comprises the output node of system 100.

Figure 2:
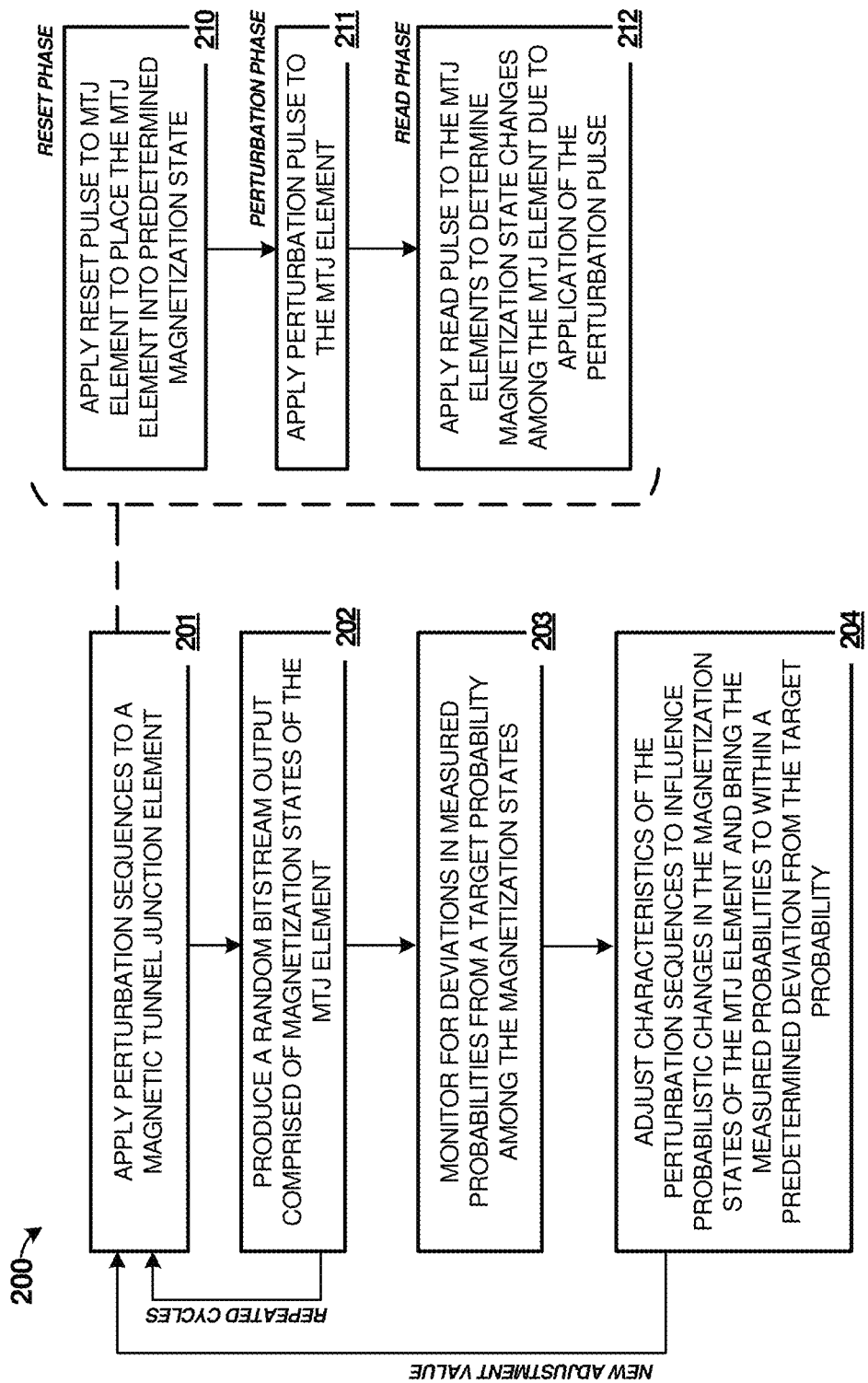
FIG. 2 illustrates an example operation of a random number generation system.

To further describe operation of the elements of FIG. 1, flow diagram 200 is presented in FIG. 2. FIG. 2 illustrates example operations of random number generation circuitry. Although the operations of FIG. 2 are discussed in the context of FIG. 1, similar operations can be applied to systems and circuitry found in the other Figures presented herein. Operations of FIG. 2 can be controlled by individual elements of FIG. 1, although centralized or distributed control system might instead be employed.

In FIG. 2, pulse generator 120 applies (201) perturbation sequences to a magnetic tunnel junction (MTJ) element, such as MTJ element 130 of FIG. 1. Pulse generator 120 determine characteristics of perturbation sequences to be applied in a repeated or cyclical fashion to the MTJ elements based on a target switching probability to be achieved for MTJ element 130. Specifically, perturbation pulse widths and amplitudes can be selected according to a target probability, such as 50% switching probability or other measure. Once pulse widths/durations and amplitudes are determined for perturbation pulses, then pulse generator 120 applies the perturbation sequences (that include the perturbation pulses) to random bitstream generator blocks, such as RBG circuits 110-112, to produce magnetization state changes in associated MTJ elements 130. It should be noted that pulse widths might be selected as the sole characteristic for adjusting perturbation pulses according to a target probability, while pulse amplitudes are produced at a fixed level. In other examples, pulse amplitudes, or combinations or pulse widths and pulse amplitudes, might be adjusted according to a target probability.

In RBG circuit 110 of FIG. 1, MTJ element 130 probabilistically changes magnetization state in response to each cycle of perturbation pulse application, after being reset into an initial magnetization state. Responsive to each application of the perturbation pulses, MTJ element 130 may or may not change magnetization state. Although the characteristics of the perturbation pulses influence the probabilistic switching behavior of MTJ element 130, stochastic behavior is still exhibited by MTJ element 130 with a probability of switching influenced by the characteristics of the perturbation pulses. Since the characteristics of the perturbation pulses are determined based in part on a target switching probability, then switching behavior of each MTJ element will, on average, exhibit changes in magnetization state near to the target switching probability.

Sense amplifier 143 produces (202) a random bitstream output comprised of magnetization states of MTJ element 130. Magnetization state changes are read from MTJ element 130 during associated read phases, and sense amplifier 143 is configured to sense magnetization state changes of MTJ element 130. Specifically, indications of the magnetization states will be produced at a free layer terminal 134 of MTJ element 130 onto link 160, and sense amplifier 143 can detect these indications. Sense amplifier 143 can produce a further indication on links 161/164 in a desired signal format, such as a desired logic level or voltage level.

Each state change can be indicated by a 'bit' on links 161/164. In a first example output type, only changes in magnetization state are detected by sense amplifier 143 responsive to application of the read pulses to MTJ element 130. Sense amplifier 143 can be configured to produce a first indication on links 161/164 when changes in magnetization state are detected, and remain in a previous output state when no changes are detected. In this first example output type, the random bitstream output comprises indications of changes in magnetization state of MTJ element 130 due to the perturbation sequences. In a second example output type, sense amplifier 143, or other support circuitry, produces outputs that indicate present magnetization states of MTJ element 130 after application of read pulses. A first magnetization state (such as parallel or P) can correspond to a logic '0' level, while a second magnetization state (such as anti-parallel or AP) can correspond to a logic '1' level. Other various output levels can instead be employed. In this second example output type, the random bitstream output comprises changes and non-changes in the magnetization state of MTJ element 130. The first example output type and second example output type can be employed to produce random bitstream outputs.

When more than one RBG circuit is employed, similar operations as described herein for RBG circuit 110 can be performed. Moreover, a random number output can be presented over link 170 for delivery to any external circuit, or to other circuitry which might be integrated with system 100. Output element 150 can combine bitstream outputs from more than one RBG circuit to produce random number output. This random number output can comprise an 'n'-bit vector in a binary format, or some other equivalent format. Several RBG circuits can produce random bit outputs in parallel, and output element 150 can combine a bit from each RBG circuit to form the random number output. In some examples, output element 150 takes more than one bit, or portion of a bitstream, from each RBG circuit to produce the random number output. The random number output over link 170 can be provided to a control system or host system for further control of system 100. When a host system is employed, this host system might comprise one or more computer systems, software elements, or other hardware/software control systems.

A plurality of RBG circuits might be employed (i.e. 'm' number of RBG circuits), which might number in the dozens, hundreds, or thousands. As mentioned above, output element 150 can combine the individual bitstream outputs received from each RBG circuit into a result for presentation as a random number output over link 170. The random number output comprises a digital representation of the combined bitstreams. To combine the bitstreams received from the various RBG circuits, output element 150 can include various logic, concatenation circuitry, combination circuitry, or processing systems which perform one or more operations on the bitstreams, or a portion thereof. For example, 'm' number of RBG circuits are employed to produce associated bitstreams, and the individual bitstreams indicate state changes for an associated MTJ elements. A function can be applied to determine a combination of a predetermined portion of the bitstreams of 'm' quantity of RBG circuits. The random number output can thus comprise an 'n'-bit vector composed of a selected portion of each bitstream produced by each RBG circuit over a period of time. The portions of each bitstream can be combined to form larger random numbers, such as 'x' bits from each 'm' parallel bitstream combined into an output number of (x*m=n) digits. In one example, the portion of each bitstream is a single bit, and thus 'm' would equal 'n'. Larger portions of each bitstream can be instead combined to form larger random numbers.

However, both the bitstreams output individually by each RBG circuit and the combined random number output over link 170 can suffer from deviations in measured probability away from a target probability. If the target probability is 50% for a true random number generator function, then deviations in outputs of RBG circuits might produce 49% or 51% probability outputs instead of the target. Other arbitrary probability targets can have similar deviations. Probability compensator 140 is employed to compensate for these deviations and to bring operation of RBG circuits 110-112 back to within a predetermined deviation of the target probability. During application of perturbation sequences and related sensing of magnetization state changes, probability compensator 140 monitors (203) for deviations in measured probabilities from a target probability among the magnetization states. Responsive to deviations detected in measured probabilities from the target probability, probability compensator 140 adjusts (204) characteristics of the perturbation sequences to influence probabilistic changes in the magnetization states of MTJ element 130 and bring the measured probabilities to within a predetermined deviation from the target probability.

In one example operation of probability compensator 140, probability calculator 141 monitors bitstream outputs produced on link 161. For a predetermined period of time or predetermined sample of bits, probability calculator 141 monitors the bitstream and determines a measured or actual probability achieved by RBG circuit 110. One example quantity of bits includes 1000 samples of link 161, although other quantities of samples might be monitored. The probability can be calculated using various logic or processing circuitry, such as circuitry configured to compute a number of bit changes over a total number of bits. When the probability is calculated to deviate from the target probability, then probability calculator 141 can output a probability deviation indicator over probability output terminal 162. This probability deviation indicator can indicate an analog or digital voltage representation of an amount of deviation that is needed to be corrected by probability compensator 140 to return the measured probability of the bitstream back to the target probability. For example, the probability deviation indicator can comprise a number of bits in deviation over the predetermined period, or a voltage indicating a magnitude and +/- direction of deviation. Other representations can be provided over probability output terminal 162.

The target probability discussed herein can be hard-coded or hard-wired into elements of system 100, such as in pulse generator 120 or probability compensator 140. The target probability can instead be selectable via target probability input 171, or a corresponding input to pulse generator 120 (not shown in FIG. 1). A range of probability targets might be employed, such as when pulse generator 120 is configured to produce perturbation pulses for a 'coarse' probability target, and probability compensator 140 can make 'fine' adjustments within a particular range of the coarse probability target. The target probability can be indicated to system 100 using a digital or analog representation of a target percentage value, a probability value from 0-1, or other representation. In further examples, one or more configurable storage registers can be employed in system 100 which can hold present values for the target probability. Users or operators might alter these target probabilities over time.

Responsive to receiving the probability deviation indicator over probability output terminal 162, voltage offset circuitry 142 produces adjustments to reference node 163 which is coupled to pinned layer terminal 135 of MTJ element 130. Reference node 163 is an adjustable reference node, which comprises an electrical node from which voltages can be referenced for perturbation sequences applied to MTJ element 130. These adjustments to reference node 163 effectively alter a 'ground' or reference potential that MTJ element 130 experiences during application of at least perturbation pulses during perturbation sequences. The alterations in reference potential to MTJ element 130 can affect the magnetization switching behavior under the influence of the perturbation pulses, which ultimately can bring the magnetization switching behavior of the corresponding RBG circuit back to the target probability. A reference buffer, analog voltage modification circuitry, transistor circuitry, or other circuit elements can be included in voltage offset circuitry 142 to alter the reference potential provided to MTJ element 130.

Returning to a discussion of the perturbation sequences, operations 201-202 are repeated in a cyclic fashion to produce a random bitstream output, with associated perturbation sequences applied for each cycle. One cycle through a sequence of reset, perturbation, and read phases comprises a perturbation sequence. Perturbation sequences can be repeated many times to produce a corresponding length of random bitstream. The random bitstream values indicated above will correspond to the magnetization states that occur for each MTJ resultant from the applied perturbation sequences. Operations 201-204 can be repeated after probability compensation adjustments have been made to a reference voltage applied to a corresponding MTJ element.

A more detailed discussion now follows regarding the perturbation sequences indicated in operation 201. As mentioned above, perturbation sequences comprise various phases, which in this example includes reset phases, perturbation phases, and read phases. Reset phases occur before perturbation phases to initialize MTJ elements into predetermined initial magnetization states. During reset phases (210), pulse generator 120 produces reset pulses having a relatively high pulse amplitude across associated MTJ elements in a first polarity or first direction. Pulse generator 120 produces the reset pulse as a voltage pulse or current pulse introduced on pulse output terminal 121. Although reset pulses are applied in a similar direction/polarity as read pulses, reset pulses are typically of a higher magnitude (amplitude and/or duration) than read pulses. These reset pulses typically do not vary upon target switching probability and are instead a predetermined voltage pulse or current pulse that place the respective MTJ element into an initial magnetization state. The initial magnetization state can be anti-parallel (AP) or parallel (P), but in the examples herein an initial magnetization state of AP will be considered.

After each reset phase, a perturbation phase occurs (211). During the perturbation phases, pulse generator 120 applies perturbation pulses to the MTJ elements over pulse output terminal 121. Perturbation phases occur before read phases to probabilistically switch magnetization states of MTJ elements using perturbation pulses. As perturbation pulses are applied, the MTJ elements can switch from an initial magnetization state established during the reset phase to a different magnetization state, or remain in the initial magnetization state. For example, if the initial magnetization state comprises the anti-parallel (AP) magnetization state, then the MTJ elements might individually change into parallel (P) magnetization states or remain in the AP states.

Read phases (212) occur after application of the perturbation pulses. During the read phases, pulse generator 120 applies read pulses to the MTJ elements over pulse output terminal 121 to determine magnetization state changes among the MTJ elements due to previous application of the perturbation pulses. When a change in state occurs in a particular MTJ element, a read pulse will produce a signal at an electrical terminal coupled to the free layer of the MTJ element that indicates a change in magnetization state. This signal might comprise a voltage spike resultant from application of a read pulse to the MTJ element. A voltage spike can comprise a short-duration increase in voltage at the electrical terminal coupled to the free layer of the MTJ element resultant from a read current passing through the MTJ element. For MTJ element 130 in FIG. 1, voltage spikes can be provided over corresponding link 160 to sense amplifier 143, and subsequently output as a bitstream on link 164.

Figure 3:
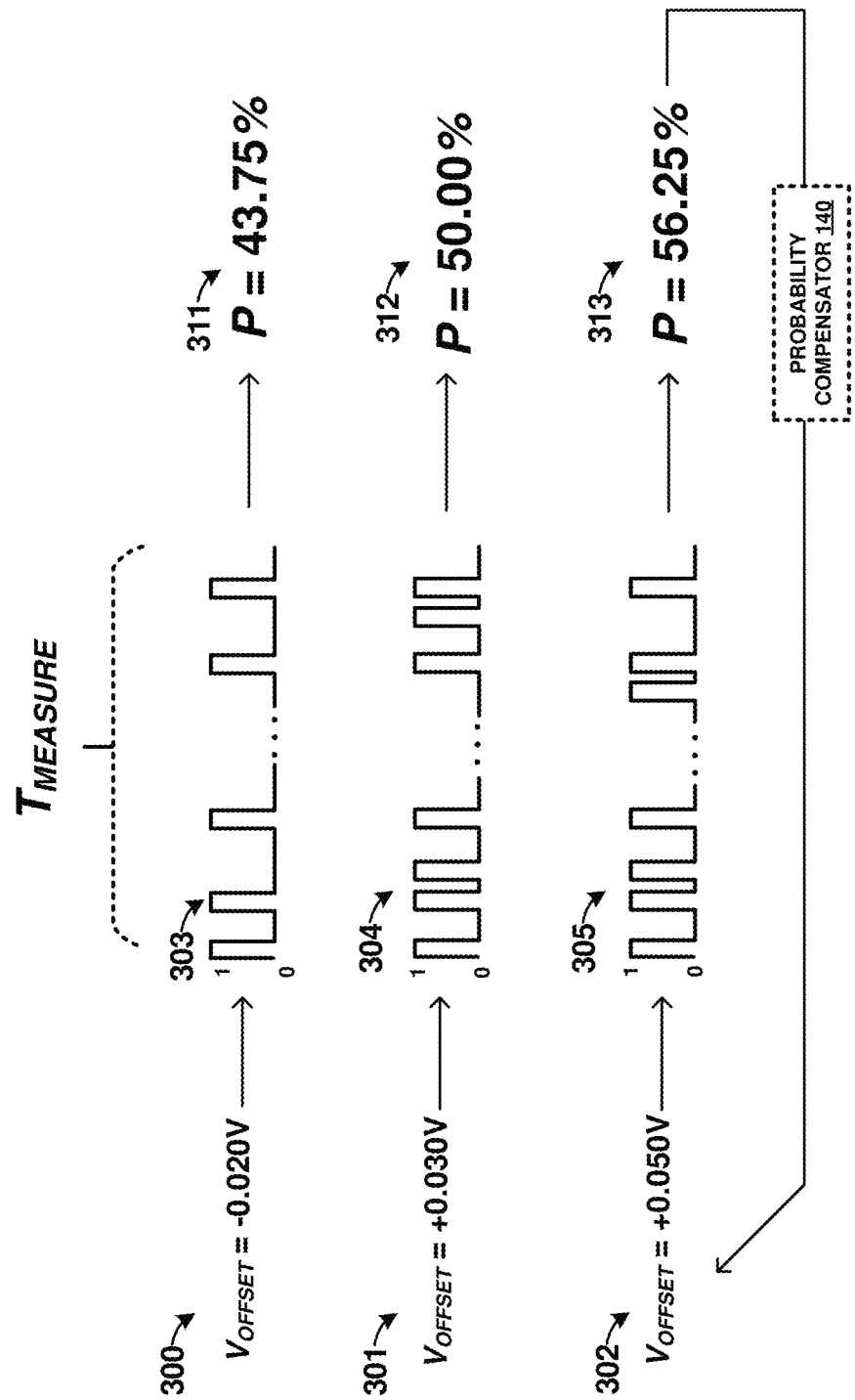
FIG. 3 illustrates example probability compensation in a random number generation system.

FIG. 3 is now presented to further illustrate example operations of the elements of FIG. 1. FIG. 3 is a waveform diagram presented to illustrate example measured bitstream outputs over a range of probability adjustments 300-302. In FIG. 3, the adjustments are made using $V_{OFFSET}$ adjustments established by probability compensator 140, but other forms of adjustment can be employed. A single random bitstream generator of FIG. 1 produces each sample bitstream 303-305, such as any of RBG circuits 110-112. During a sample period indicated by $T_{MEASURE}$ in FIG. 3, a series of perturbation sequences are applied to an exemplary random bitstream generator. Thus, during this $T_{MEASURE}$ period, several perturbation sequences are applied to an MTJ element to produce a corresponding number of bits.

Three example adjustment voltages ($V_{OFFSET}$) from a ground potential of 0 volts (V) are shown in FIG. 3 as applied to reference voltage output 163, namely −0.020V for example 300, +0.030V for example 301, and +0.050V for example 302. Bitstream waveforms 303-305 are produced responsive to perturbation sequences applied to the associated MTJ element, which might include conditioning or filtering by an associated sense amplifier to other circuitry. A plurality of perturbation sequences are applied to the MTJ element in the examples of FIG. 3, with a corresponding pulse train representative of probability adjustments made with the particular adjustment voltages, $V_{OFFSET}$.

In FIG. 3, the example adjustment voltages are each presented at reference voltage output 163 which responsively alters a reference potential of an MTJ element for applied perturbation pulses. The adjustment voltages are adjustments from an ideal 'ground' voltage of 0 volts. As the pulse generator presents each perturbation pulse to the MTJ element, the MTJ element will probabilistically either change magnetization state or remain in an initial magnetization state. Bitstream waveforms 303-305 are reflective of resultant magnetizations states, with a 'high' or '1' level indicating a magnetization state change from an initial state and a 'low' or '0' level indicating no change in magnetization state from an initial state.

Each of bitstream waveforms 303-305 has a corresponding quantity of magnetization changes probabilistically correlated to adjustments made to $V_{OFFSET}$. For output waveform 303 (corresponding to a $V_{OFFSET}$ of −0.020V), the quantity of magnetization state changes over the $T_{MEASURE}$ period indicate a switching probability 311 of 43.75%. For output waveform 304, (corresponding to a $V_{OFFSET}$ of +0.030V), the quantity of magnetization state changes over the $T_{MEASURE}$ period indicate a switching probability 312 of 50.00%. For output waveform 305 (corresponding to a $V_{OFFSET}$ of +0.050V), the quantity of magnetization state changes over the $T_{MEASURE}$ period indicate a switching probability 313 of 56.25%. Thus, if a target probability is set to 50%, then the $V_{OFFSET}$ of +0.030V corresponds best to the target probability (e.g. 50.00% probability). Each bitstream generator circuit will have individually determined $V_{OFFSET}$ values which are applied to a corresponding reference voltage output. Thus, the example $V_{OFFSET}$ of +0.030V for FIG. 3 would typically only be valid for a single MTJ element or bitstream generator circuit. As mentioned above, periodic adjustments can be made to $V_{OFFSET}$ to ensure the target probability is being achieved.

Once individual bitstream generator circuits have been compensated according to the enhanced processes and circuitry discussed herein, bitstream outputs can be further generated to establish parallel outputs and multi-bit vectors which correspond to multi-digit random numbers. A selected number 'm' of parallel bitstream generator circuits can be employed, with each output combined to form the multi-bit vector outputs. Advantageously, each bitstream generator circuit can generate random bit values simultaneously, and each perturbation sequence can thus produce an 'm'-digit number.

Figure 4:
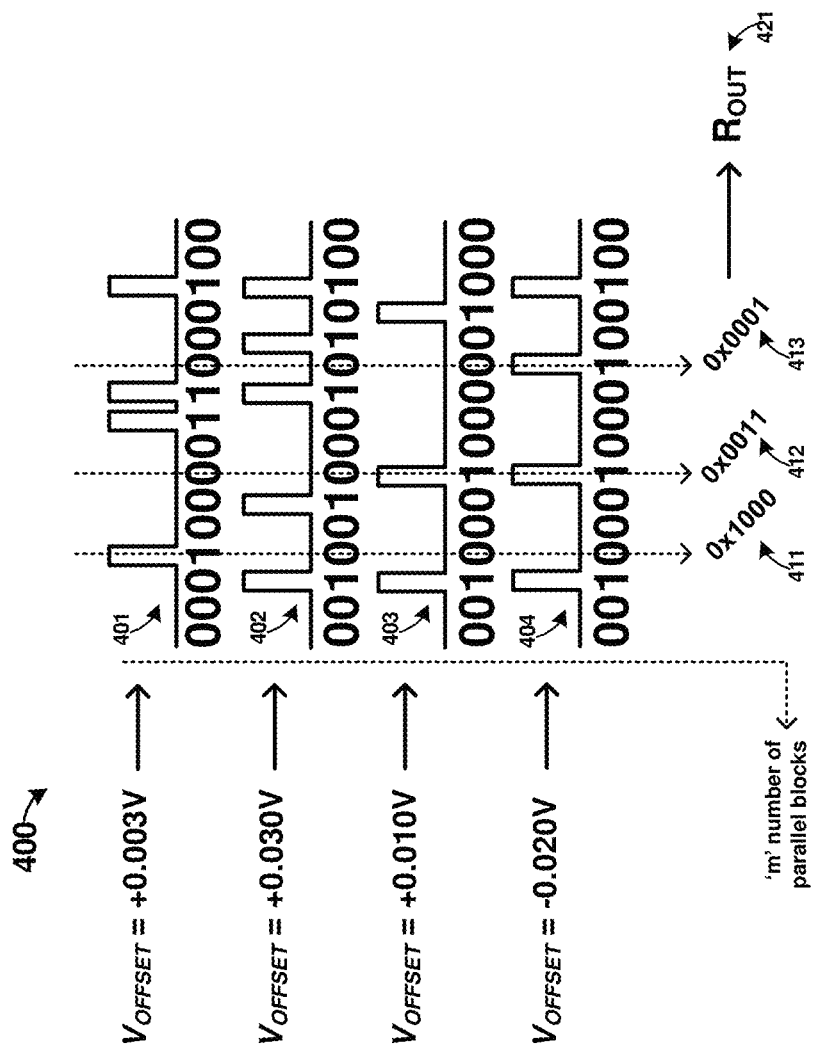
FIG. 4 illustrates example outputs of a random number generation system.

To illustrate parallel bitstream generator circuit systems with corresponding bitstream counts, FIG. 4 is presented. FIG. 4 is a waveform diagram 400 presented to illustrate example outputs for the 'm'-digit parallel bitstream generator circuit scheme of FIG. 1, such as for a combined usage of RBG circuits 110-112, among others. The example in FIG. 4 illustrates results from several perturbation sequences for four MTJ elements employed in a parallel arrangement that form a four-channel bitstream generator. Although four parallel bitstreams are shown in FIG. 4, this arrangement can be scaled up or down to 'm' number of parallel bitstream generator circuits, that have 'n' number of perturbation sequences applied. A selector or selection circuitry can be employed to select a desired number of parallel bitstream generator circuits to form the multi-channel bitstream generator circuits.

In FIG. 4, pulse generator 120 generates repeated perturbation sequences with characteristics determined in part from a target probability. Specifically, pulse amplitudes or pulse widths of perturbation pulses are determined based on the target probability, such as by a proportional or scaled translations from the target probability to pulse amplitudes or pulse widths of perturbation pulses. As the pulse generators present each perturbation pulse to MTJ elements, the MTJ elements probabilistically change magnetization state or remain in an initial magnetization state. Output waveforms 401-404 are reflective of resultant magnetizations states, with a 'high' or '1' level indicating a magnetization state change from an initial state and a 'low' or '0' level indicating no change in magnetization state.

During application of the repeated perturbation sequences, probability compensator 140 applies calibrated voltage offsets ($V_{OFFSET}$) to pinned layer terminals of each MTJ element. Specifically, a $V_{OFFSET}$ of +0.003V is applied for bitstream 401, a $V_{OFFSET}$ of +0.030V is applied for bitstream 402, a $V_{OFFSET}$ of +0.010V is applied for bitstream 403, and a $V_{OFFSET}$ of −0.020V is applied for bitstream 404. Although sixteen (16) bits are produced for each example bitstream, individual bits of each bitstream can be combined into output value 421 corresponding to a random number ($R_{OUT}$). For example, output 411 is formed from the fourth bit in each 16-bit bitstream, and has a value of 0x1000, or '8' in base-10. Output 412 is formed from the seventh bit in each 16-bit bitstream, and has a value of 0x0011 or '3' in base-10. Output 413 is formed from the eleventh bit in each 16-bit bitstream, and has a value of 0x0001 or '1' in base-10. Thus, individual output numbers are produced concurrently with the number of bits in the output numbers corresponding to the quantity of parallel bitstream generator circuits.

Advantageously, the multi-channel or highly-parallel bitstream generator circuits and operations shown in FIG. 1 and FIG. 4 provide for faster random number generation times than single-channel bitstream generator circuit arrangements. A large quantity of parallel bitstream generator circuits are combined to produce a digital output comprising a random number. When a single bitstream generator circuit arrangement is employed, obtaining an n-digit random number would require n-number of perturbation sequences. For example, to generate a 256-bit Advanced Encryption Standard (AES-256) encryption key, then 256 perturbation cycles would need to occur. Advantageously, when the multi-channel bitstream generator circuit arrangements are employed as discussed herein, these 256 bits can be obtained in a single perturbation cycle when 256 parallel bitstream generator circuits are employed, or a greater number of perturbation cycles when less than 256 parallel bitstream generator circuit are employed. The outputs of these parallel bitstream generator circuit are combined as discussed herein to produce an n-digit random number. Since each parallel bitstream generator circuit has a corresponding output generated probabilistically using an MTJ element, then variation will occur among measured bitstream probabilities for a target probability. This variation can be advantageously compensated for using enhanced probability compensation circuitry which individually applies calibrated voltage offsets ($V_{OFFSET}$) to each MTJ element.

Figure 5:
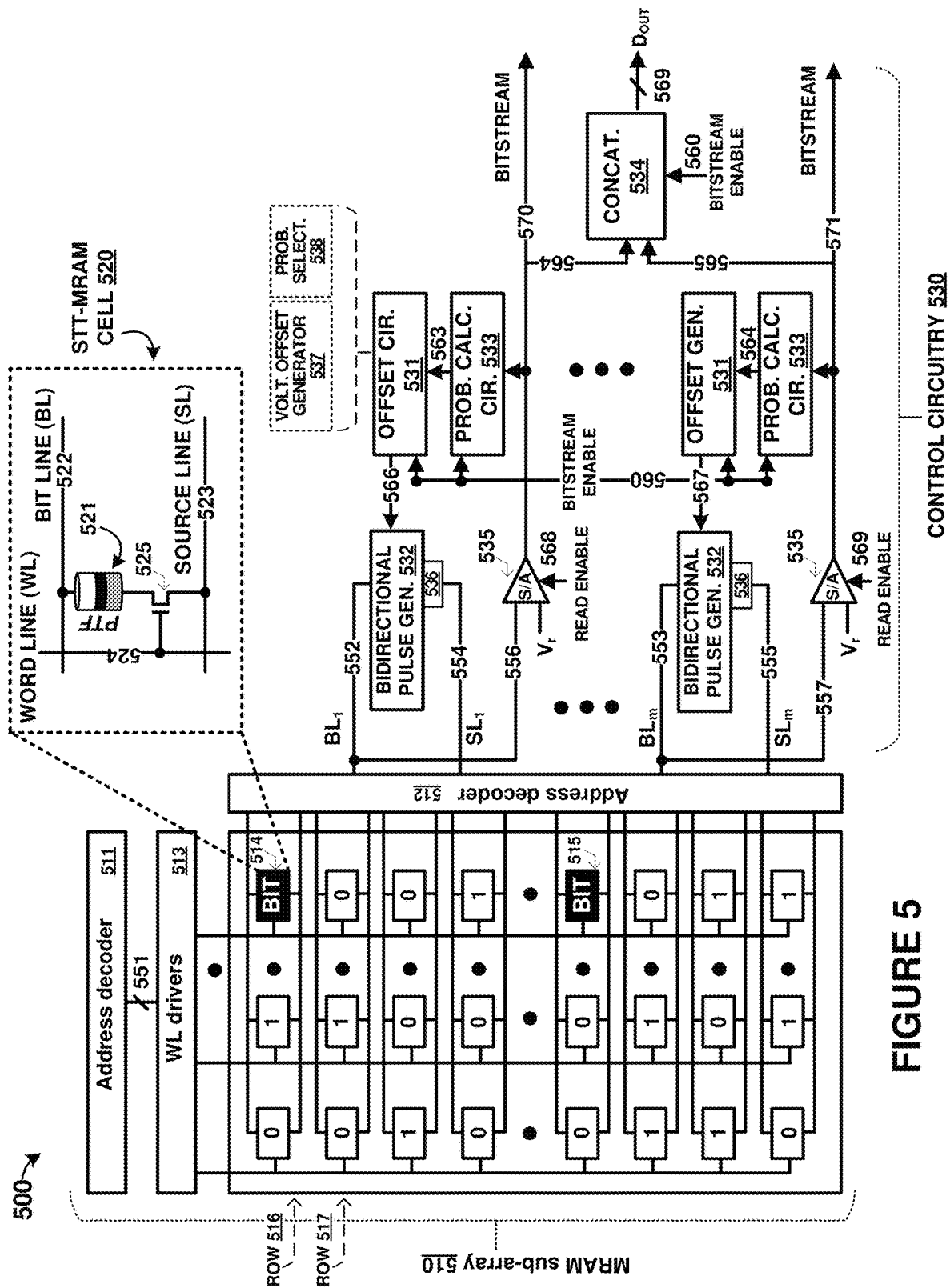
FIG. 5 illustrates an example array of random number generation circuitry.

To illustrate further architectures and arrangements for parallel bitstream generator circuits, FIG. 5 is presented. FIG. 5 illustrates example array 500 of bitstream generator circuitry, which is formed among an example magneto-resistive random-access memory (MRAM) array. Array 500 can be manufactured onto a semiconductor substrate along with various control logic, interconnect, or other circuitry. In some examples, an MRAM array will have wordlines and bitlines formed among MRAM devices spanning horizontally with respect to a substrate. Other array configurations and arrangements of MRAM arrays and associated control/interconnect logic can be formed that vary from that shown in FIG. 5, such as vertically stacked arrays.

Array 500 includes MRAM sub-array 510 and control circuitry 530. MRAM sub-array 510 is comprised of rows and columns of STT-MRAM cells, column address decoder 511, row address decoder 512, and word line (WL) drivers 513. A plurality of rows, such as shown for example rows 516-517, are formed from several STT-MRAM cells comprised of MTJ elements. Rows of MRAM sub-array 510 each have a corresponding bit line (BL) and source line (SL) controlled by row address decoder 512. Columns of MRAM sub-array 510 each have a corresponding word line (WL) controlled by column address decoder 511 and WL drivers 513. Thus, MRAM sub-array 510 forms an addressable array having a plurality of memory bits each formed from a corresponding MTJ element. Within each row of MRAM sub-array 510, a selected memory bit might be used for bitstream generation purposes, such as discussed herein for random bit generators. Control circuitry 530 can select among the memory bits of MRAM sub-array 510 to employ various ones of the STT-MRAM cells for either memory storage or random bit generation. Although only two example bitstream generation bits 514-515 are highlighted in FIG. 5, in further examples a larger number of bits are employed in large multi-channel bitstream generator systems formed among memory bits in an SRAM array. Thus, only a portion of a much larger SRAM array is shown by MRAM sub-array 510 in FIG. 5.

A detailed view of STT-MRAM cell 520 is shown as an example of any of the memory bits of MRAM sub-array 510. Although cell 520 is shown as expanded from bit 514, cell 520 can represent a structure/configuration of any of the memory bits included herein, whether employed as a memory storage element or as a random bit generator element. Cell 520 is comprised of a STT-type of MTJ element 521, with pinned layer (P), tunnel layer (T), and free layer (F) shown. Switching element 525, which might comprise a transistor, selector, transmission gate, or other selectable element, is coupled at source and drain terminals between example source line (SL) 523 and pinned layer terminal of MTJ element 521. A control terminal of switching element 525 is coupled to example word line (WL) 524. A free layer terminal of MTJ element 521 is coupled to example bit line (BL) 522. The same STT-type of MTJ element is employed in memory storage applications and with random bit generator applications.

Selection and control circuitry, comprised of portions of control circuitry 530 and portions of MRAM sub-array 510, can selectively employ ones of the memory bits in storage applications and other ones of the memory bits in random bit generator applications. Thus, an adjustable and dynamic configuration among memory and random bit generator functions can be achieved in MRAM sub-array 510, such as when a different number of random bit generator elements might be desired for particular random bit generator tasks. Memory bits not employed for random bit generator tasks might be employed to store bitstream outputs of individual random bit generator elements or digital outputs of multi-channel bitstream generation systems, such as by using bit arrays formed from a plurality of memory bits of MRAM sub-array 510. The quantity of memory bits employed in random bit generator applications might be selected by control circuitry 530, or other control circuitry not shown in FIG. 5, to achieve desired sizes of random numbers generated in each perturbation sequence. To achieve larger random numbers, more memory bits might be employed. Conversely, to achieve smaller random numbers, fewer memory bits might be employed.

Turning now to control circuitry 530, the various circuitry shown in FIG. 5 is representative of at least a portion of control circuitry or control system elements for MRAM sub-array 510 and bitstream generation systems. Further elements might be included but are not shown in FIG. 5 for clarity. These further elements can include microprocessors, processing systems, host systems, and the like. Control circuitry 530 includes voltage offset circuitry 531, bidirectional pulse generators 532, probability calculator circuitry 533, concatenation element 534, sense amplifiers 535, and reference buffers 536. Voltage offset circuitry 531 further includes probability selector 538, voltage offset generator 537. Portions of control circuitry 530 can be enabled/disabled by corresponding bitstream enable link 560.

An adjustable target probability is selected using probability selection element 538. The target probability can be introduced to probability selection element 538 using an input signal, data register, user interface, or other input mechanism. In some examples, such as true random generator (TRNG) examples of 50% probability, this target probability can be hard-coded or hard-wired. Probability selection element 538 provides an indication of the target probability to a corresponding bidirectional pulse generator 532 over corresponding link 566-567.

Each bidirectional pulse generator 532 is coupled to a bit line and source line for a particular memory bit of MRAM sub-array 510. For example, a first bidirectional pulse generator 532 is coupled to $BL_1$ at link 552 and $SL_1$ at link 554, and a given 'm' bidirectional pulse generator 532 is coupled to $BL_M$ at link 553 and $SL_M$ at link 555. Address decoder 512 can selectively couple links 552-555 to any row of MRAM sub-array 510, such as shown for rows corresponding to bit 514 and bit 515 in FIG. 5. In this manner, each bidirectional pulse generator 532 can apply pulses across a selected MTJ element. These pulses can have adjustable pulse widths and pulse amplitudes, as discussed herein. Bidirectional pulse generators 532 determine amplitude or duration characteristics of perturbation pulses in the perturbation sequences according to at least the target probabilities which are indicated from probability selection element 538.

Moreover, each bidirectional pulse generator 532 can adjust a reference potential applied to the MTJ element. Voltage offset generator 537 of voltage offset circuitry 531 indicates voltage offsets to a corresponding bidirectional pulse generator 532, which employs reference buffer 536 to implement the voltage offsets. Reference buffers 536 can be included to alter a reference potential of the MTJ element coupled at a corresponding source line to a pinned layer terminal of an MTJ element (through a corresponding selection element). Reference buffers 536 implement an adjustable reference potential for each MTJ element, as controlled by a corresponding bidirectional pulse generator 532. In FIG. 5, links 554-555 comprise adjustable reference nodes for bidirectional pulse generators 532.

To determine the voltage offsets, probability calculation circuitry 533 and voltage offset circuitry 531 are included. Probability calculation circuitry 533 monitors bitstreams produced on links 570-571 and measures probabilities exhibited in the bitstreams. When deviations are measured between a target probability and a measured probability, then probability calculation circuitry 533 can indicate this deviation in probability to voltage offset circuitry 531. Voltage offset circuitry 531 determines a voltage offset which can correct or compensate for the deviation between the target probability and the measured probability. Voltage offset circuitry 531 might use a lookup table to quickly compute a voltage offset ($V_{OFFSET}$), or compute $V_{OFFSET}$ using mathematical/algorithmic relationships instead. Voltage offset circuitry 531 then produce indicators of voltage offsets over corresponding links 566-567, and bidirectional pulse generators 532 can implement these voltage offsets using at least reference buffers 536.

During bitstream generation, various MTJ elements in MRAM sub-array 510 produce outputs corresponding to present magnetization states. Sense amplifiers 535 detect outputs of each MTJ element, such as over links 556 and 557 in FIG. 5. These outputs of each MTJ element correspond to changes in magnetization state of the MTJ elements responsive to perturbation pulses and subsequent read pulses issued by a corresponding bidirectional pulse generator 532. Each sense amplifier 535 is coupled at a sense input to a bit line (such as via links 556 and 557) and coupled at a reference input to a reference voltage, $V_R$. Typically, $V_R$ will be set to a ground potential or zero (0) volts, but this configuration might vary in other examples. Also, it should be noted that the reference voltage $V_R$ for each sense amplifier 535 might vary from a reference potential applied to each MTJ element. A read enable signal is coupled to each sense amplifier to gate sampling of the sense input to coincide with application of the read pulses by bidirectional pulse generators 532.

Bitstream outputs are provided over links 564-565 to concatenation element 534. Concatenation element 534 takes these individual bitstream outputs as inputs and applies one or more combination processes to produce a digital output ($D_{OUT}$) at link 569. As discussed herein, the combination processes might comprise concatenation of bits, or might instead include a mathematical algorithm. $D_{OUT}$ comprises a bit vector of a predetermined bit width corresponding to a desired quantity of digits in an output number. In some examples, the quantity of digits corresponds to the number of bitstream outputs employed. In other examples, more than one bit from each bitstream output is combined to form a larger output number. Outputs of sense amplifier 535 can alternatively be provided over links 570-571 for direct bitstream readout. The direct bitstream readout can be coupled to external systems that are employed to substitute for elements of control circuitry 530, such as logic arrays, processing devices, host systems, or for conversion into other forms of interface signaling.

Figure 6:
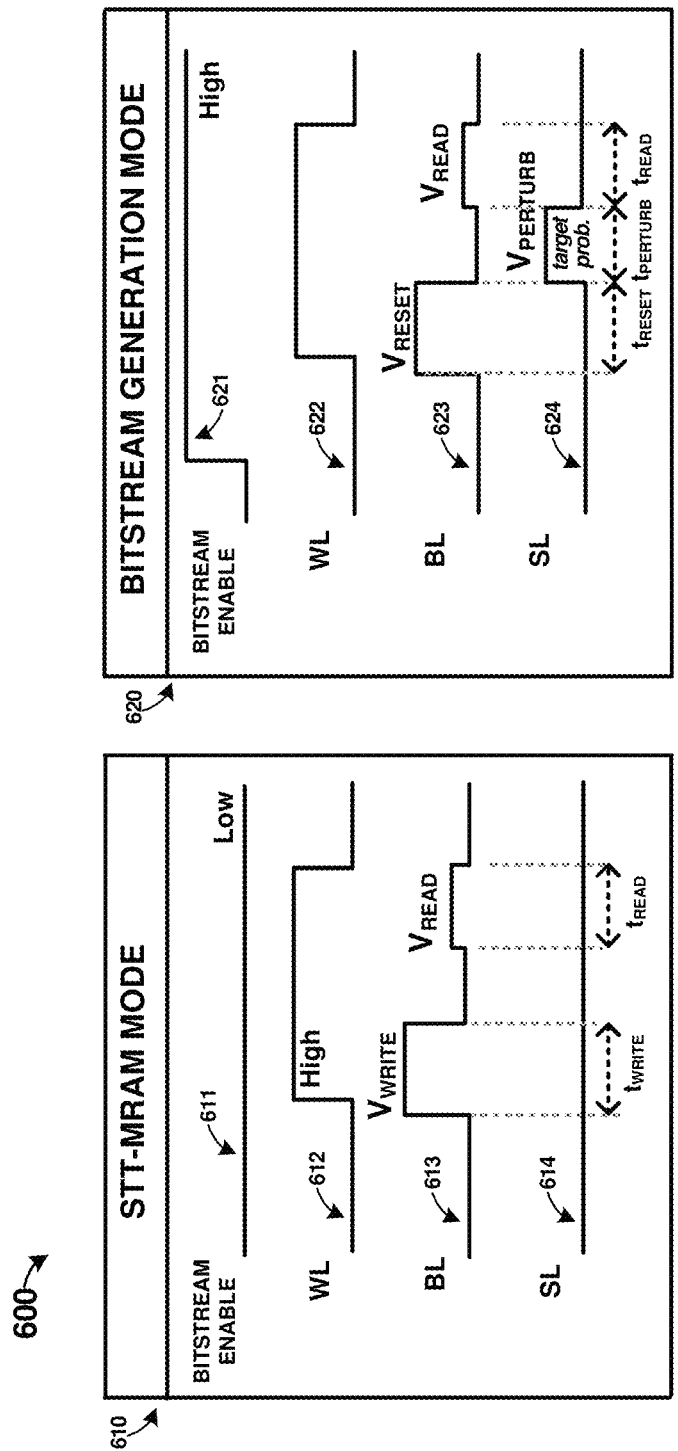
FIG. 6 illustrates example control operations of random number generation circuitry.

FIG. 6 illustrates example control operations 600 of bitstream generation circuitry, such as control portions of MRAM sub-array 510 and control circuitry 530. In FIG. 6, two functional modes are represented, namely STT-MRAM mode in signal view 610 and bitstream generation mode in view 620. STT-MRAM mode corresponds to operating an MRAM cell as a memory storage bit, whereas bitstream generation mode corresponds to operating an MRAM cell as a bitstream generation element. Any of the memory bits in MRAM sub-array 510 can be operated in either STT-MRAM mode or bitstream generation mode, depending upon the particular control signaling and connected control elements.

For signal view 610 representing the STT-MRAM mode, a bitstream enable signal 611 is held at a logic low (or '0') level to ensure that elements tied to link 560 are inactive. Word line (WL) signal 612 indicates a low level followed by a logic 'high' (or '1') level to enable a particular selection element associated with a desired MTJ element, such as seen for the detailed view of cell 520. A bit line (BL) signal 613 has a $V_{WRITE}$ write voltage pulse applied for a $T_{WRITE}$ period to write a value into the MTJ element for storage. The source line (SL) signal is held low for the process of writing to act as a reference potential for the MTJ element. Thus, an MTJ element can be employed as a memory storage element for one bit of data. At a later time, this bit of data can be read out as the MTJ magnetization state by applying a $V_{READ}$ read voltage pulse to BL for a $T_{READ}$ period, as indicated in BL signal 613. $V_{READ}$ is of a lower relative voltage amplitude than $V_{WRITE}$, and exact values will vary based on implementation.

For signal view 620 representing the bitstream generation mode, a bitstream enable signal 621 is held at a logic high (or '1') level to ensure that elements tied to link 560 are active. Word line (WL) signal 622 indicates a low level followed by a logic 'high' (or '1') level to enable a particular selection element associated with a desired MTJ element, such as seen for the detailed view of cell 520. A bit line (BL) signal 623 has a $V_{RESET}$ reset voltage pulse applied for a $T_{RESET}$ period to reset the MTJ element into a preselected initial magnetization state, such as anti-parallel indicated by the polarity of the applied reset pulse. Then, a perturbation pulse ($V_{PERTURB}$) is applied by holding the BL to a low level while the SL signal 524 is briefly pulsed to $V_{PERTURB}$ for a duration of $T_{PERTURB}$.

As discussed herein, the perturbation voltage/amplitude ($V_{PERTURB}$) and duration ($T_{PERTURB}$) vary according to the target probability. This perturbation pulse probabilistically changes the magnetization state of the associated MTJ element according to characteristics of the perturbation pulse and other stochastic properties. Additionally, voltage offset circuitry 531 provides voltage offset information to bidirectional pulse generators 532 over links 556-567 which act in a bi-directional manner to apply a corresponding voltage offset ($V_{OFFSET}$) to at least perturbation pulses generated across BL/SL pairs for each particular MTJ element. This voltage offset can be applied to the SL lines 554-555 in some examples, or achieved using small pulse amplitude adjustments that consider $V_{OFFSET}$ when applied across BL/SL pairs.

At a later time in signal view 620, the MTJ magnetization state can be read out by applying a $V_{READ}$ voltage pulse to BL for a $T_{READ}$ period, as indicated in BL signal 613. SL signal 624 is held low during this $T_{READ}$ period. $V_{READ}$ is of a lower relative voltage amplitude than $V_{RESET}$ and $V_{PERTURB}$, and exact values will vary based on implementation. In this example, the perturbation pulse ($V_{PERTURB}$) is applied in a different polarity or direction than the reset pulse and subsequent read pulse. Thus, bidirectional pulse generators 532 act in a bi-directional manner to apply corresponding voltage pulses across BL/SL pairs for each particular MTJ element. In this manner, an MTJ element can be employed as a bitstream generation element.

Each bitstream generation element, comprising a single-channel bitstream generator, is controlled in a similar fashion as described for operations in signal view 620 of FIG. 6, with the $V_{PERTURB}$ values set proportional to the target probability. A selector can be configured to enable a selected quantity of a plurality of single-channel bitstream generators to achieve random numbers having a desired quantity of digits for output produced over link 569. The digital output produced over link 569 is based on a target probability, and comprises a bit vector having a quantity 'n' of bits. A selector can select a quantity 'm' of the plurality of single-channel bitstream generators for inclusion into a multi-channel bitstream generation system to provide m-bit concurrently, which might be combined by concatenation element 534 to form an n-bit number. A selector as discussed herein can comprise elements of address decoders 511-512 as directed by as associated control system or host system. Alternatively, the selector can include switching elements, multiplexors, and logic circuitry to control selection operations.

Advantageously, large arrays of parallel-operated bitstream generation elements can be employed by array 500 to form multi-channel bitstream generation systems, which might comprise true random number generator (TRNG) processes when 50% target probability is selected. As discussed herein, an array of single-channel bitstream generators forms array 500. This array comprises 1-'m' single-channel bitstream generators, which are represented schematically as individual RNG circuits 110-112 in FIG. 1. In FIG. 5, these single-channel bitstream generators are formed from selected MRAM rows having corresponding MTJ elements. These MTJ elements are each incorporated into single-channel bitstream generators formed from the MTJ elements, portions of address decoders 511-512, bidirectional pulse generators 523, voltage offset circuitry 531, probability calculation circuitry 533, sense amplifiers 535, and associated interconnect. Although coupled in a generally parallel fashion, each single-channel bitstream generator may have associated connection circuitry, interface logic, or other interworking element to couple single-channel bitstream generators to form an array. Outputs of each bitstream generator can be individually presented over links 570-571, or combined by concatenation element 534 to form a multi-bit combined number presented on output link 569.

Figure 7:
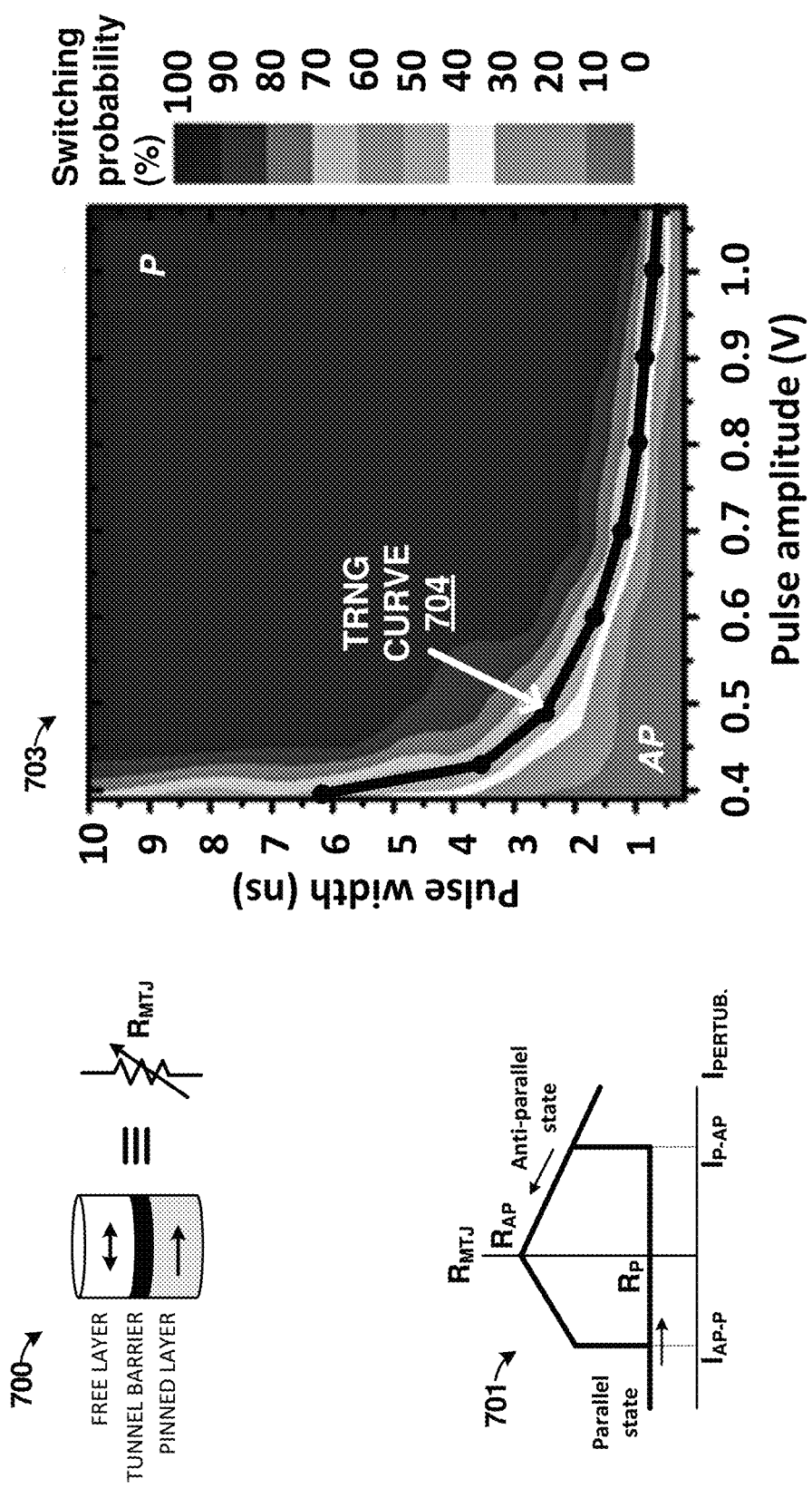
FIG. 7 illustrates example state operations of magnetic tunnel junction elements.

To further illustrate magnetization state changes among MTJ elements, FIG. 7 is presented. FIG. 7 illustrates operation of MTJ elements that switch states among an anti-parallel (AP) state and parallel (P) state. Example MTJ element configuration is shown having a pinned layer, tunnel barrier layer, and free layer. The pinned layer typically has a magnetization fixed in a particular orientation, such as shown in FIG. 7. The free layer can change orientation according to applied current or voltage pulses. When both the pinned layer and free layer are in the same magnetic orientation, then the two layers can be considered in the 'parallel' state. When the pinned layer and free layer are in different magnetic orientations, then the two layers can be considered in the 'anti-parallel' state. This MTJ element configuration can be represented schematically as a state-alterable resistor element shown in configuration 700.

To change states among the MTJ element, such as by changing relative magnetic orientations among the pinned layer and free layer, current or voltage pulses can be applied to the MTJ element. Graph 701 illustrates one example state change arrangement. Graph 701 shows how application of a perturbation current ($I_{PERTURB}$), an MTJ element can be placed from an initial AP state into a subsequent P state, and from an initial P state into a subsequent AP state. Hysteresis-like behavior is exhibited, where a sufficient magnitude (pulse amplitude) and duration (pulse width) of the perturbation current is needed to change the state of the MTJ element once it has changed into another state. The various P and AP states have an associated resistance ($R_{MTJ}$) associated therewith, indicated by the vertical axis in graph 701. In graph 701, the AP state has a high associated resistance ($R_{AP}$) relative to the P state, while the P state has a low associated resistance ($R_P$) relative to the AP state. These resistance changes can be utilized to produce an output responsive to a read pulse, as discussed herein.

As mentioned above, characteristics of a perturbation pulse, such as a magnitude and duration, can influence the state changes. Typically, a pulse or pulse train is applied to an MTJ element to attempt to change the state of the MTJ element. As seen in graph 703, this pulse can have a pulse width and pulse amplitude. The pulse width can be represented in seconds (or nanoseconds in FIG. 7), while the pulse amplitude can be represented in a voltage or amperage. FIG. 7 illustrates a voltage amplitude, which can induce a current for the MTJ element. Insufficient pulse width or pulse amplitude can lead to non-switching of the state of the MTJ element, as associated magnetization starts leaking once the applied pulse is removed. A sufficient pulse width or pulse amplitude, or a sufficient series of pulses, can lead to switching of states by the MTJ element. Thus, the MTJ element exhibits a probabilistic or stochastic behavior. Random thermal fluctuation in an MTJ element can be utilized for generating random bit values. Switching probability is a strong function of characteristics of the applied perturbation pulse. Once the MTJ element changes magnetization state, the MTJ element has to be reset back to the initial state. Hence, the operation of the MTJ element can be resolved into three cycles, namely a "perturbation" phase followed by a "read" phase and "reset" phase.

Graph 703 of FIG. 7 provides an illustration of characterization of behavior of an MTJ element under various pulse widths (in nanoseconds) along the vertical axis and various pulse amplitudes (in voltage) along the horizontal axis. A 50% contour line 704 is shown to illustrate an example characteristic behavior of a true random number generator (TRNG) behavior of an MTJ element for a range of pulse widths and pulse amplitudes. Each contour shade indicates a region of associated switching probability for an MTJ element from an AP state to a P state. The various probability compensation circuitry discussed herein adjusts characteristics of perturbation pulses, and thus affects switching probability of the MTJ element as shown in graph 703. This switching probability may vary from the 50% contour line 704, and probability compensation circuitry is provided herein to bring exhibited probability back to within a target probability of the 50% contour line. Thus, the MTJ elements discussed herein can be employed to produce true randomness in output numbers compensated for drift and manufacturing variability. Also, parallel circuit arrangements can be employed for faster random number generation times in fewer perturbation cycles than individual random number generation circuits.

In some implementations of the systems, circuitry, and elements discussed herein, a stochastic circuit can be established. The stochastic circuit can comprise a random number generator circuit, among other circuits. The stochastic circuit can include a means for applying reset pulses to a plurality of magnetic tunnel junction (MTJ) elements to reset the MTJ elements into predetermined magnetization states. The stochastic circuit can include a means for applying perturbation pulses to the plurality of MTJ elements after application of the reset pulses to influence magnetization states of the plurality of MTJ elements. The stochastic circuit can include a means for applying read pulses to the plurality of MTJ elements after application of the perturbation pulses to indicate the magnetization states among the plurality of MTJ elements. The stochastic circuit can include a means for presenting the magnetization states as a multi-bit number corresponding to a stochastic output, and a means for measuring probabilities among changes in the magnetization states due to repeated sequential application of the reset pulses, perturbation pulses, and read pulses. The stochastic circuit can include a means for detecting deviations among the probabilities from a target probability, and means for indicating adjustments to the perturbation pulses to bring the probabilities to within a predetermined deviation from the target probability. The stochastic circuit can further include a means for selecting the target probability over a probability range by altering the adjustments to the perturbation pulses.

The means for applying reset pulses, means for applying perturbation pulses, and means for applying read pulses can each comprise any of pulse generator 120, pulse output terminal 121, links 160-163, RBG circuits 110-112, MTJ element 130, probability compensator 140, probability calculator 141, voltage offset circuitry 142, MRAM sub-array 510, control circuitry 530, bidirectional pulse generators 532, links 551-555, link 560, address decoder 511, WL drivers 513, address decoder 512, and associated bit lines, source lines, and word lines, among other elements discussed herein. The means for measuring probabilities among changes in the magnetization states due to repeated sequential application of the reset pulses, perturbation pulses, and read pulses can comprise any of RBG circuits 110-112, MTJ element 130, probability compensator 140, probability calculator 141, voltage offset circuitry 142, sense amplifier 143, links 160-166, control circuitry 530, probability calculation circuit 533, offset generator 531, links 566-567, reference buffer 536, voltage offset generator 537, sense amplifiers 535, sense input links 556-557, sense output links 566-567, read enable links 568-569, enable link 560, count output links 570-571, and concatenation element 534, among other elements discussed herein. The means for detecting deviations among the probabilities from a target probability, and means for indicating adjustments to the perturbation pulses to bring the probabilities to within a predetermined deviation from the target probability can comprise any of RBG circuits 110-112, MTJ element 130, probability compensator 140, probability calculator 141, voltage offset circuitry 142, sense amplifier 143, links 160-166, control circuitry 530, probability calculation circuit 533, offset generator 531, links 566-567, reference buffer 536, voltage offset generator 537, sense amplifiers 535, sense input links 556-557, sense output links 566-567, enable link 560, read enable links 568-569, count output links 570-571, and concatenation element 534. The means for means for presenting the magnetization states as a multi-bit number corresponding to a stochastic output can comprise any of RBG circuits 110-112, output element 150, output link 170, links 164-166, control circuitry 530, enable link 560, links 564-565, sense output links 568-569, output links 570-571, concatenation element 534, and digital output link 569, among other elements discussed herein. The means for selecting the target probability over a probability range by altering the adjustments to the perturbation pulses can include control circuitry 530, bidirectional pulse generators 532, probability calculation circuit 533, offset generator 531, links 566-567, reference buffer 536, voltage offset generator 537, probability selector 538, sense amplifiers 535, sense input links 556-557, sense output links 566-567, read enable links 568-569, enable link 560, count output and links 570-571, among other elements discussed herein.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. A circuit comprising:
    a pulse generator having a pulse output terminal configured to produce perturbation pulses;
    a random bitstream generator comprising:
        a magnetic tunnel junction (MTJ) element coupled at a free layer terminal to the pulse output terminal of the pulse generator, and coupled at a pinned layer terminal to an adjustable reference node; and
        an output node for the circuit coupled to the free layer terminal of the MTJ element; and
    a probability compensator comprising:
        a probability calculator coupled to the output node and configured to determine deviations from a target probability exhibited by the MTJ element responsive to the perturbation pulses;
        a voltage offset generator coupled to a probability output terminal of the probability calculator; and
        a reference buffer coupled to an output terminal of the voltage offset generator, wherein the reference buffer includes the adjustable reference node.

2. The circuit of claim 1, wherein the MTJ element is configured to probabilistically change magnetization state responsive to the perturbation pulses applied between the pulse output terminal and the adjustable reference node.

3. The circuit of claim 1, wherein the MTJ element comprises a memory bit in a magnetic random-access memory (MRAM) array selectable as either a memory storage element or a random bit generator element.

4. The circuit of claim 1, wherein the pulse generator comprises a bidirectional pulse generation element to selectively apply reset pulses and read pulses through the MTJ element in a first direction via the pulse output terminal, and selectively apply perturbation pulses through the MTJ element in a second direction via the pulse output terminal.

5. The circuit of claim 1, further comprising a random bit vector:
    wherein the output node comprises a first bit of the random bit vector; and
    wherein a second output node of a second random bitstream generator comprises a second bit of the random bit vector.

6. An apparatus comprising:
    a plurality of random bit generators comprising magnetic tunnel junction (MTJ) elements configured to produce probabilistic changes in magnetization states responsive to applied perturbation sequences;
    probability adjustment circuitry configured to monitor the probabilistic changes in the magnetization states for deviations in measured probabilities from a target probability, and initiate adjustments to the perturbation sequences to influence the probabilistic changes in the magnetization states of the MTJ elements and bring the measured probabilities to within a predetermined deviation from the target probability;
    one or more pulse generators configured to apply the perturbation sequences to the plurality of random bit generators in accordance with at least the adjustments initiated by the probability adjustment circuitry; and
    output circuitry configured to present a random bit vector comprised of the magnetization states of the plurality of random bit generators from at least one perturbation sequence.

7. The apparatus of claim 6, wherein the perturbation sequences comprise:
    reset phases which apply reset voltage pulses to the MTJ elements to place the MTJ elements into predetermined magnetization states before application of perturbation voltage pulses;
    perturbation phases which apply the perturbation voltage pulses to the MTJ elements to produce the probabilistic changes in the magnetization states; and
    read phases which apply read voltage pulses to the MTJ elements by the one or more pulse generators to determine the magnetization states among the MTJ elements due to application of the perturbation voltage pulses.

8. The apparatus of claim 6, wherein the probability adjustment circuitry is configured to perform the adjustments to the perturbation sequences by altering one or more among pulse amplitudes, pulse widths, and reference voltages associated with application of perturbation voltage pulses by the one or more pulse generators that produce the probabilistic changes in the magnetization states.

9. The apparatus of claim 6, wherein the probability adjustment circuitry monitors the magnetization states of the plurality of random bit generators across a predetermined quantity perturbation sequences to determine the deviations in the measured probabilities from the target probability.

10. The apparatus of claim 6, wherein each of the MTJ elements have associated free layer terminals that generate and apply the perturbation sequences; and
    wherein each of the MTJ elements have associated pinned layer terminals coupled to adjustable reference nodes that can vary in applied reference voltages according to the adjustments to the perturbation sequences.

11. The apparatus of claim 6, wherein the target probability is selectable over a probability range by altering the adjustments to the perturbation sequences.

12. The apparatus of claim 6, wherein the perturbation sequences are repeated in a cyclical manner to produce a series of random bit vector outputs; and
wherein the probability adjustment circuitry initiates the adjustments to the perturbation sequences after monitoring a predetermined quantity of random bit vectors.

13. A method of random number generation, comprising:
applying reset pulses to magnetic tunnel junction (MTJ) elements included in a plurality of random bitstream generators, the reset pulses placing the MTJ elements into predetermined magnetization states;
applying perturbation reset pulses to the MTJ elements;
applying read pulses to the MTJ elements to determine magnetization states among the MTJ elements after application of the perturbation pulses; and
producing random bit vector outputs comprised of each of the magnetization states of the plurality of random bitstream generators after application of at least one corresponding read pulse; and
monitoring for deviations in measured probabilities from a target probability among the magnetization states; and
making adjustments to the perturbation pulses to influence probabilistic changes in the magnetization states of the MTJ elements and bring the measured probabilities to within a predetermined deviation from the target probability.

14. The method of claim 13, further comprising:
repeating application of the perturbation pulses alternated with the read pulses and corresponding reset pulses to produce a series of random bit vector outputs; and
making the adjustments to the perturbation pulses after monitoring a predetermined quantity of random bit vector outputs.

15. The method of claim 13, wherein making the adjustments to the perturbation pulses comprises altering one or more among pulse amplitudes, pulse widths, and reference voltages associated with application of the perturbation pulses to the plurality of random bitstream generators.

16. The method of claim 13, further comprising:
wherein the perturbation pulses are applied to free layer terminals of the MTJ elements as perturbation voltage pulses with first polarities;
wherein the read pulses are applied to the free layer terminals of the MTJ elements as read voltage pulses with the first polarities;
wherein the reset pulses are applied to the free layer terminals of the MTJ elements as reset voltage pulses with second polarities opposite of the first polarities; and
wherein pinned layer terminals of the MTJ elements are coupled to adjustable reference voltages used to make amplitude adjustments to the perturbation pulses to influence the probabilistic changes in the magnetization states of the MTJ elements.

17. The method of claim 13, wherein the target probability is selectable over a probability range by altering the adjustments to the perturbation pulses.

18. A system to generate random numbers, comprising:
a magnetic random-access memory (MRAM) array formed from rows of data storage elements, and comprising address decoder circuitry configured to allocate selected rows into either a first set or a second set;
wherein a first set of the rows has associated data storage elements employed in data storage operations, and wherein a second set of the rows has selected data storage elements employed in random number generation circuitry; and
control circuitry for the random number generation circuitry comprising:
pulse generators configured to apply at least perturbation sequences across selected data storage elements of the second set of the rows to probabilistically influence magnetization states of the data storage elements;
output circuitry configured to present an output bit vector comprised of indications of the magnetization states of the selected data storage elements; and
probability compensators configured to measure probabilities among the indications in the magnetization states due to the perturbation sequences, detect deviations among the probabilities from a target probability, and indicate adjustments to reference voltages to be applied by the pulse generators to the selected data storage elements, wherein the adjustments are selected to bring the probabilities to within a predetermined deviation from the target probability.

19. The system of claim 18, wherein the control circuitry is configured to cycle through application of the perturbation sequences to produce a series of output bit vectors; and
wherein the perturbation sequences each comprise application of reset pulses, perturbation pulses, and read pulses;
wherein the pulse generators apply the reset pulses to place the selected data storage elements into predetermined magnetization states prior to application of the perturbation pulses;
wherein the pulse generators apply the perturbation pulses to probabilistically influence the magnetization states of the data storage elements; and
wherein the pulse generators apply the read pulses to determine the indications of the magnetization states of the selected data storage elements.

20. The system of claim 19, wherein the pulse generators have an input voltage that sets at least one of a pulse width and pulse amplitude of the perturbation pulses to achieve an initial approximation of the target probability for the selected data storage elements; and
wherein actual probabilities for magnetization state changes of the selected data storage elements responsive to the perturbation pulses are influenced by the adjustments to the reference voltages to compensate for at least manufacturing and temperature variations among characteristics of the selected data storage elements.

21. The system of claim 18, wherein the data storage elements comprise magnetic tunnel junction (MTJ) elements having free layer terminals coupled to bit lines of the MRAM array, and pinned layer terminals coupled by selection elements to source lines of the MRAM array, and wherein control terminals of the selection elements are coupled to word lines of the MRAM array.

22. The system of claim 21, wherein the pulse generators apply the perturbation sequences over associated bit lines and associated source lines as corresponding voltage pulses.

23. The system of claim 18, wherein the adjustments to the reference voltages to be applied by the pulse generators to the selected data storage elements adjust amplitudes of perturbation pulses provided by the pulse generators to influence probabilistic magnetization state changes in the selected data storage elements.

24. A stochastic circuit comprising:
   means for applying reset pulses to a plurality of magnetic tunnel junction (MTJ) elements to reset the MTJ elements into predetermined magnetization states;
   means for applying perturbation pulses to the plurality of MTJ elements after application of the reset pulses to influence magnetization states of the plurality of MTJ elements;
   means for applying read pulses to the plurality of MTJ elements after application of the perturbation pulses to indicate the magnetization states among the plurality of MTJ elements;
   means for presenting the magnetization states as a multi-bit number corresponding to a stochastic output;
   means for measuring probabilities among changes in the magnetization states due to repeated sequential application of the reset pulses, perturbation pulses, and read pulses;
   means for detecting deviations among the probabilities from a target probability; and
   means for indicating adjustments to the perturbation pulses to bring the probabilities to within a predetermined deviation from the target probability.

25. The stochastic circuit of claim 24, further comprising:
   means for selecting the target probability over a probability range by altering the adjustments to the perturbation pulses.

* * * * *